United States Patent
Aksamit

(10) Patent No.: US 6,480,032 B1
(45) Date of Patent: Nov. 12, 2002

(54) GATE ARRAY ARCHITECTURE

(75) Inventor: Randy J. Aksamit, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/262,459

(22) Filed: Mar. 4, 1999

(51) Int. Cl.[7] ............................................. H03K 19/00
(52) U.S. Cl. ..................... 326/102; 326/44; 257/202
(58) Field of Search ........................... 326/39, 44, 49, 326/101, 102; 257/202, 206

(56) References Cited

U.S. PATENT DOCUMENTS

| | | | |
|---|---|---|---|
| 4,644,187 A | | 2/1987 | Haji |
| 4,851,892 A | | 7/1989 | Anderson et al. |
| 5,053,993 A | | 10/1991 | Miura |
| 5,055,716 A | | 10/1991 | El Gamel |
| 5,068,548 A | | 11/1991 | El Gamel |
| 5,162,666 A | * | 11/1992 | Tran .......................... 327/407 |
| 5,289,021 A | | 2/1994 | El Gamal |
| 5,341,041 A | | 8/1994 | El Gamel |
| 5,420,447 A | * | 5/1995 | Waggoner ................... 257/206 |
| 5,489,860 A | | 2/1996 | Kitagawa |
| 5,563,430 A | | 10/1996 | Hashimoto et al. |
| 5,581,202 A | * | 12/1996 | Yano et al. .................. 326/101 |
| 5,591,995 A | * | 1/1997 | Shaw .......................... 257/206 |
| 5,616,940 A | * | 4/1997 | Kato et al. ................... 257/206 |
| 5,684,311 A | | 11/1997 | Shaw |
| 5,780,883 A | * | 7/1998 | Tran et al. ................... 257/206 |
| 5,789,966 A | | 8/1998 | Bechade |
| 5,796,128 A | | 8/1998 | Tran et al. |
| 5,923,060 A | * | 7/1999 | Gheewala ................... 257/206 |
| 6,057,568 A | * | 5/2000 | Kumagai ..................... 257/206 |

FOREIGN PATENT DOCUMENTS

| EP | 0 683 524 A1 | 4/1995 |
|---|---|---|
| EP | 0 683 524 A2 | 4/1995 |

OTHER PUBLICATIONS

SiArc Base Array, SPG Central Logic Engineering, Intel Corporation.

* cited by examiner

Primary Examiner—Don Phu Le
(74) Attorney, Agent, or Firm—Howard A. Skaist; Michael J. Willardson

(57) ABSTRACT

Briefly, in accordance with one embodiment of the invention, an integrated circuit includes: a gate array architecture. The gate array architecture includes at least one base site, the at least one base site being three tracks wide and including four N-type transistors and four P-type transistors.

Briefly, in accordance with another embodiment of the invention, a method of fabricating an integrated circuit chip includes: processing a semiconductor substrate to form a gate array architecture of transistors in the substrate. The gate array architecture includes at least one base site being three tracks wide and including four N-type transistors and four P-type transistors.

Briefly, in accordance with still another embodiment of the invention, an article includes: a storage medium, the storage medium having instructions stored thereon, the instructions, when executed, resulting in the capability to design the layout of an integrated circuit chip for fabrication, the integrated circuit chip including a gate array architecture, the gate array architecture including at least one base site being three tracks wide and including four N-type transistors and four P-type transistors.

20 Claims, 10 Drawing Sheets unbuffered two-to-one multiplexer

700

1100

GATE ARRAY ARCHITECTURE

RELATED APPLICATION

This patent application is related to concurrently file U.S. patent application Ser. No. 09/262,458, titled "gate array architecture," by B. Possley, assigned to the assignee of the present invention and herein incorporated by reference.

BACKGROUND

1. Field

The present invention is related to integrated circuit chips and, more particularly, to gate array architectures for integrated circuit chips.

2. Background Information

Gate array architectures are commonly used for many types of integrated circuit designs. In this context, the term gate array architecture refers to a repeated pattern of transistors embedded in a semiconductor substrate, such as a silicon substrate. Typically, such architectures are employed by using a "library" that comprises unique metallization patterns to create individual cells. Such gate array architectures and libraries are commonly employed in connection with computer-aided design (CAD) and computer-aided manufacturing (CAM) techniques. Employing a gate array architecture stands in contrast to the custom design of the layout of transistors on a semiconductor or silicon substrate, which is also accomplished using CAD/CAM techniques. Use of gate array architectures offers the advantage of quicker or shorter fabrication and through put time, lower costs, and ease in making fixes or logic changes after a chip design has already been completed. Unfortunately, gate array architectures also have a number of shortcomings that make them less attractive for some types of applications. Typically, gate arrays or gate array architectures are not as dense, have higher power consumption, and offer lower performance than custom circuits designed using alternative approaches. A need, therefore, exists for a gate array architecture that addresses these limitations.

SUMMARY

Briefly, in accordance with one embodiment of the invention, an integrated circuit includes: a gate array architecture. The gate array architecture includes at least one base site, the at least one base site being three tracks wide and including four N-type transistors and four P-type transistors.

Briefly, in accordance with another embodiment of the invention, a method of fabricating an integrated circuit chip includes: processing a semiconductor substrate to form a gate array architecture of transistors in the substrate. The gate array architecture includes at least one base site being three tracks wide and including four N-type transistors and four P-type transistors.

Briefly, in accordance with still another embodiment of the invention, an article includes: a storage medium, the storage medium having instructions stored thereon, the instructions, when executed, resulting in the capability to design the layout of an integrated circuit chip for fabrication, the integrated circuit chip including a gate array architecture, the gate array architecture including at least one base site being three tracks wide and including four N-type transistors and four P-type transistors

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Traditional gate array architectures employ what is commonly referred to as a "sea of transistors" or a "sea of gates" architecture. This means that the gate array base comprises a regularly repeating pattern of individual or grouped transistors. Having a large number of generic transistors is desirable so that any one of a large number of possible logic functions may be implemented by customizing the metallization above the array. A drawback of this approach is that by offering only a simple, generic transistor pattern, the resulting logic implementation may be suboptimal in terms of certain technical issues, such as density, power and/or performance.

More recent examples of gate array architectures attempt to address these issues by using a complex base structure comprising many different sizes and configurations of transistors. While this may achieve improved results in terms of density, for example, it may also restrict both synthesis and layout flexibility because the CAD/CAM tools are restricted to using exactly this predetermined mix of different base sites. As shall be described in more detail below, an embodiment of the present invention addresses this limitation by providing a complex base architecture that offers the flexibility of a conventional gate array base, while still allowing designs to achieve superior density, power, performance and routability. It accomplishes this while maintaining a gate array pattern that operates well with both synthesis and automated place and route (APR) layout tools.

Figure 2:
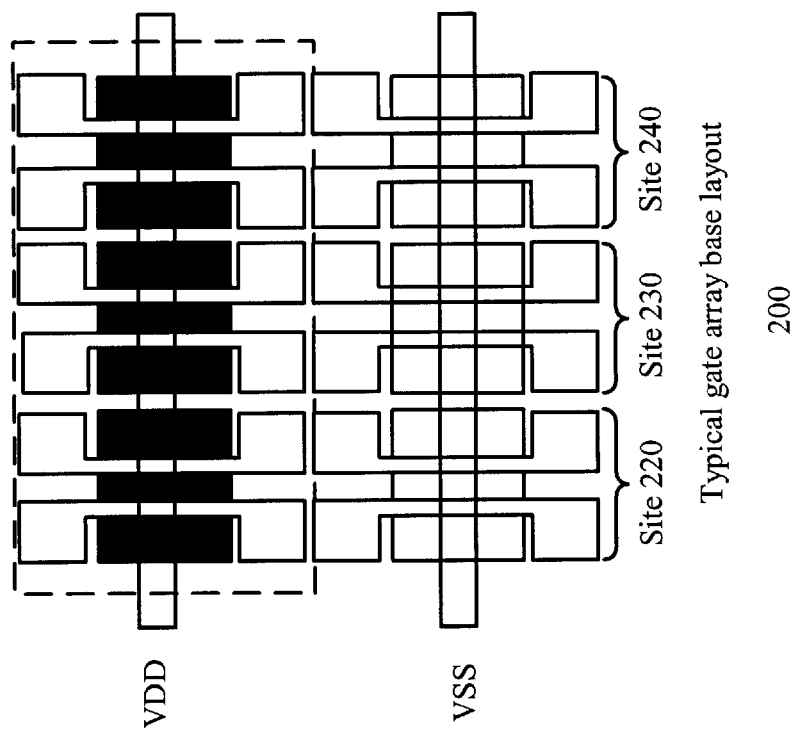
FIG. 2 is a diagram of a plan view of a typical gate array base layout.

FIG. 2 is a typical gate array architecture 200 with rows of repeating uncommitted N-type and P-type transistors. This particular example shows three sites, 220, 230, and 240, with each site being three tracks wide, and having two N-type and two P-type transistors in each site. In the diagram, the light portion indicates the N-type material and the dark or shaded portion indicates the P-type material. Each site, therefore, may implement a two input port NAND gate or other cell of equivalent complexity. However, this base has some of the limitations discussed above, because it has only one transistor size available. It is also difficult to interconnect these transistors to form a cell without using routing layers typically reserved for cell-to-cell interconnections, such as a second layer of metallization and above.

Figure 1:
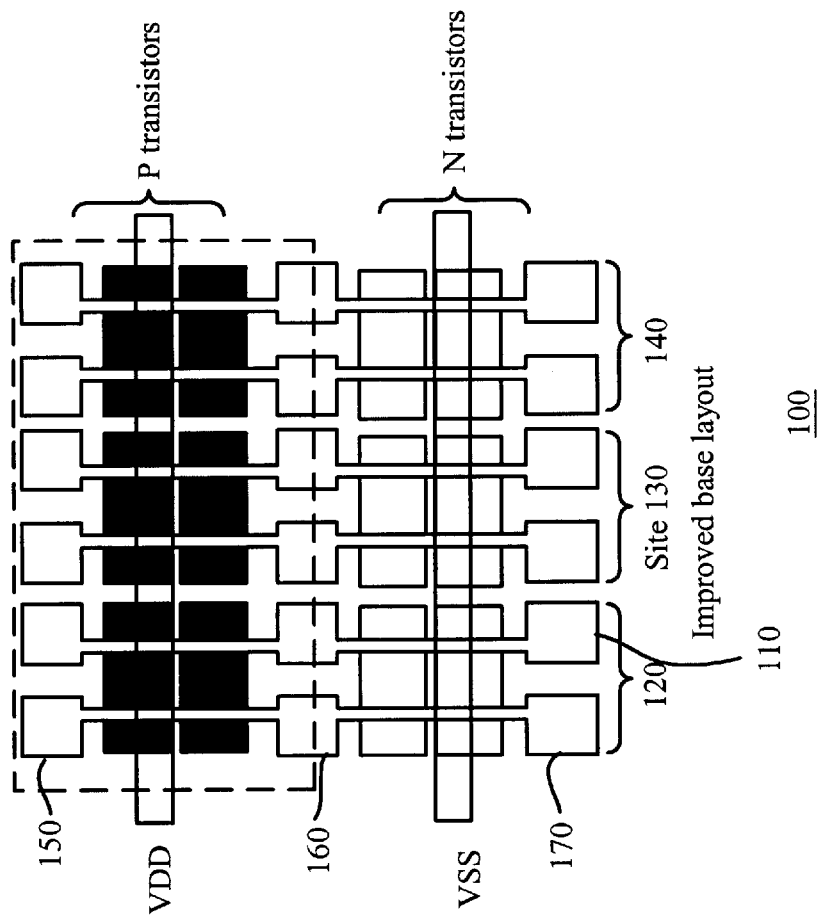
FIG. 1 is a diagram of a plan view of an embodiment of a gate array architecture in accordance with the present invention.

FIG. 1 is a schematic diagram illustrating an embodiment 100 of a gate array architecture in accordance with the present invention. The gate array architecture is illustrated as embodied on an integrated circuit chip. For this particular embodiment, three sites are also illustrated, 120, 130, and 140, each site being three tracks wide, but, here, including four N-type transistors and four P-type transistors, although the invention is not limited in scope in this respect. Therefore, in this particular embodiment, in contrast with gate array architecture 200 illustrated in FIG. 2, the large transistors of FIG. 2 are replaced with two smaller transistors. As shall be described in greater detail below, this provides a number of advantages. In addition, the embodiment illustrated in FIG. 1 also includes two common polysilicon overlay structure connections or interconnections, such as 110, for the N-type transistors and the P-type transistors in each of the three sites. This is in contrast to the gate array architecture illustrated in FIG. 2 in which the polysilicon overlay structures for the N-type transistors and the P-type transistors are not connected. Furthermore, as shall be described in more detail later, each of the base sites in this particular embodiment is symmetrical about its middle track.

The embodiment of a gate array architecture in accordance with the invention of FIG. 1 takes up substantially the same area as the gate array architecture of FIG. 2, despite the presence of a separation between the smaller transistors in the FIG. 1 embodiment that is not employed in the FIG. 2 embodiment; however, the FIG. 2 embodiment includes a separation between the P-type and N-type transistors due to the separated polysilicon landing sites that is not present in the embodiment of FIG. 1 that approximately offsets the separation between the smaller transistors that has been added.

While the traditional gate array illustrated in FIG. 2 includes four large transistors per site, the embodiment illustrated in FIG. 1 splits them so that each site includes a total of eight transistors, four small N-type transistors and four small P-type transistors. Therefore, in this particular embodiment, the small transistors are approximately half the size of the regular or full-sized transistors. One advantage of this approach is that where a conventional gate array base approach is desired, the two "split" transistors may be joined using a metallization interconnect, applied to overlay the gate array, to form the desired large transistors. However, the embodiment illustrated in FIG. 1 offers additional flexibility beyond the gate array architecture of FIG. 2 by providing eight small, rather than four large, transistors per base site, which allows implementation of an unbuffered or noninverting two-to-one multiplexer in a single site, rather than the one and one-half sites that would be employed for the gate array architecture illustrated in FIG. 2. In this context, the term unbuffered or noninverting multiplexer refers to the circuit illustrated schematically in FIG. 3. This is effectively a two-to-one multiplexer in which an inverting buffer that usually provides the output signal has been omitted.

Figure 3:
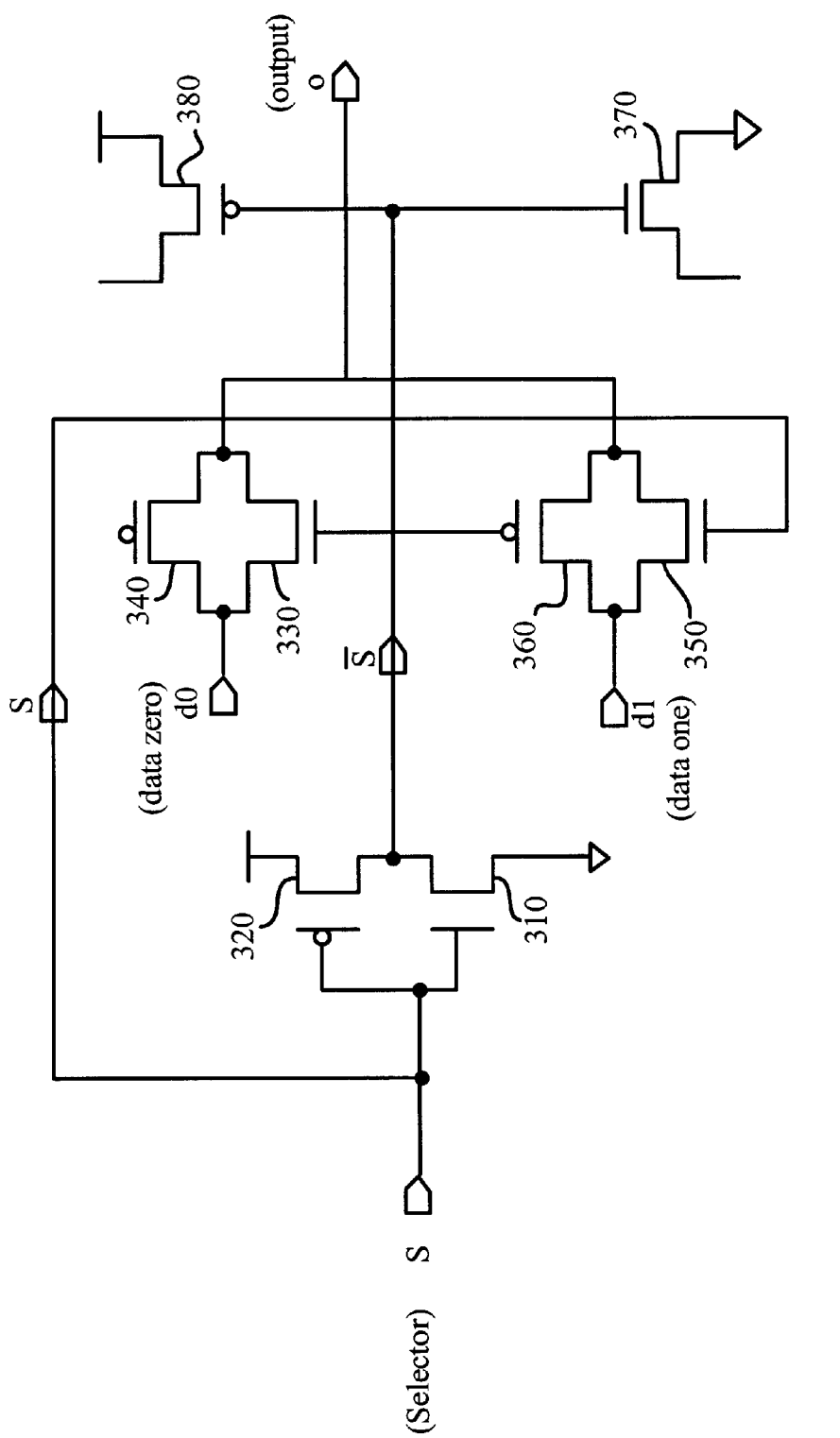
FIG. 3 is a diagram of an embodiment of a unbuffered or noninverting multiplexer.
Figure 4:
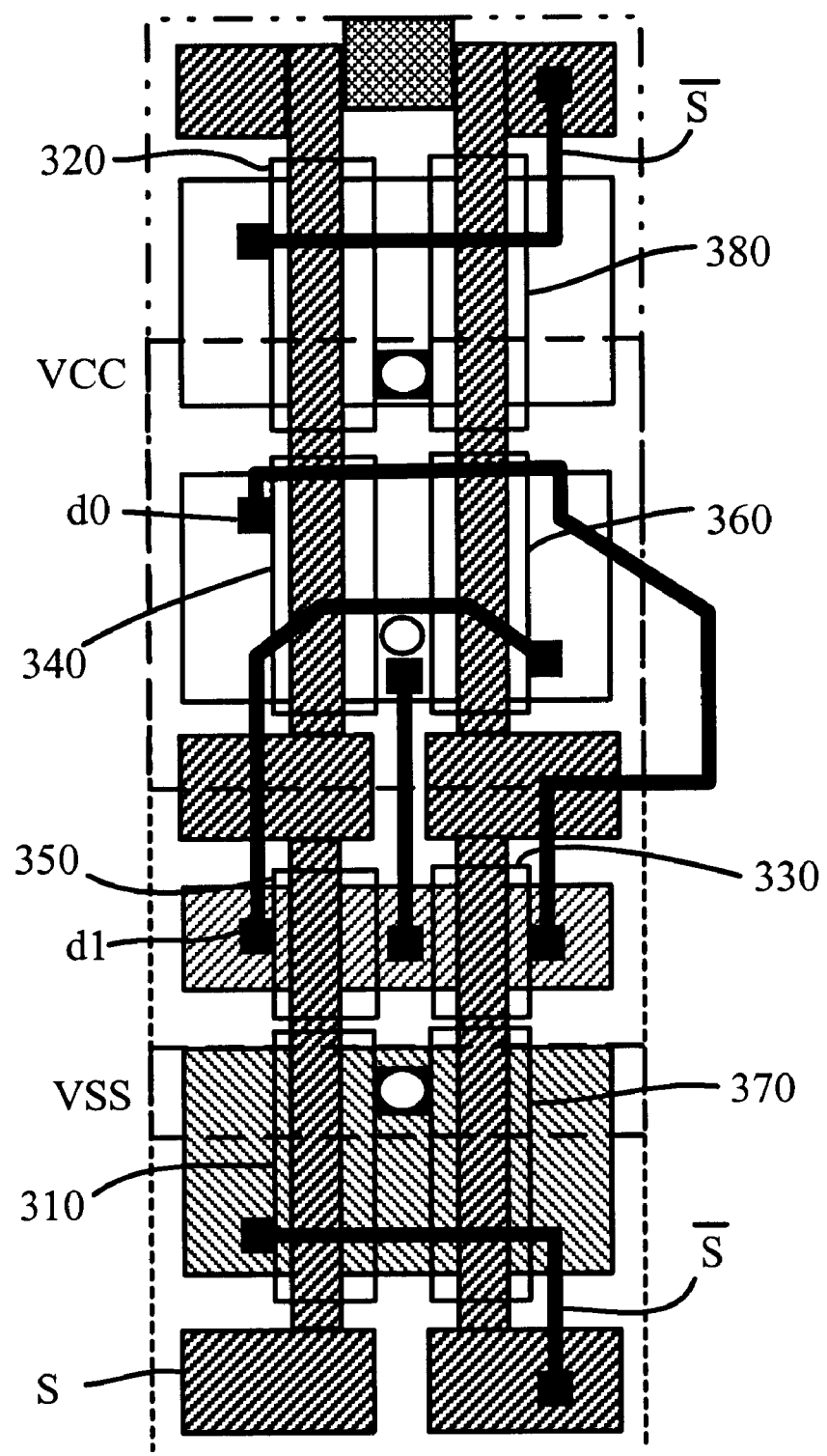
FIG. 4 is a schematic diagram illustrating the layout of metallization for the circuit of FIG. 3 using the embodiment of a gate array architecture of FIG. 1.

Having the capability to implement this particular structure is desirable because it is a structure that is frequently repeated on integrated circuit chips in a variety of cells, such as latches, flip flops, multiplexers, exclusive-OR gates, half-adders and full-adders. Therefore, by saving one half of a base site for an unbuffered or noninverting multiplexer implemented on an integrated circuit chip, the overall chip area may be reduced. Specifically, FIG. 4 is a schematic diagram of the embodiment of FIG. 1, showing metallization interconnections that would be employed in the metallization interconnect overlying the gate array architecture to implement the circuit illustrated in FIG. 3. The reference numerals of FIG. 3 are provided in FIG. 4 to show the correspondence between the circuit diagram and the gate array architecture with metallization for this embodiment.

A point to be observed for this embodiment is that two of the transistors of the gate array architecture embodiment, specifically transistors 370 and 380, are unused or not connected. This is also illustrated in the circuit diagram of FIG. 3. It is noted that this particular embodiment of a gate array architecture provides the advantages described previously and also described hereinafter, despite the fact that in this embodiment two transistors are not actually employed.

Another advantage of this embodiment in accordance with the invention relates to improved power and performance. Power is reduced by utilizing the small transistors, which have a smaller capacitance than the large or full-sized transistors, for logic that toggles frequently, such as clock input signals, for example, or for nodes that have a limited internal fan out. Likewise, performance is improved relative to a conventional gate array architecture, such as illustrated in FIG. 2, because cell input capacitance, and, therefore, input load is reduced. For example, the input capacitance of flip flop clock and data pins may be cut approximately in half. Because equivalent full-sized transistors may be created, as described above, by combining two smaller transistors, output drive capability is not diminished, however.

As previously alluded to, another aspect of the embodiment illustrated in FIG. 2 is the layout of the eight small transistors with the polysilicon interconnections, such as 110 above. This provides a "built-in" interconnect, that may be employed for the unbuffered or noninverting multiplexer illustrated in FIG. 4. As FIG. 4 illustrates, these polysilicon landings are employed as connections that would normally be accomplished by a metallization interconnect overlying a conventional gate array architecture. This allows the internal routing for any one of a number of cells that may be implemented using this particular gate array architecture to be completed exclusively in the first layer of metal. In contrast, other gate array architectures, such as the one illustrated in FIG. 2, use a second layer of metal, and sometimes even a third layer of metal, when making such internal cell connections. By utilizing only the first layer of metal for internal routing, this provides additional routing resources available for cell-to-cell connections for the APR tool. Another advantage associated with the polysilicon interconnections of this particular embodiment, such as 110 in FIG. 1, for example, is the placement of multiple distributed landing sites for interconnection, such as 150, 160, and 170. These provide further improved routability because the landing sites are aligned with several different paths of the interconnect. Because the pins are aligned with the interconnect paths this also provides multiple opportunities for pin access for the circuit being formed with the metallization.

Figure 5:
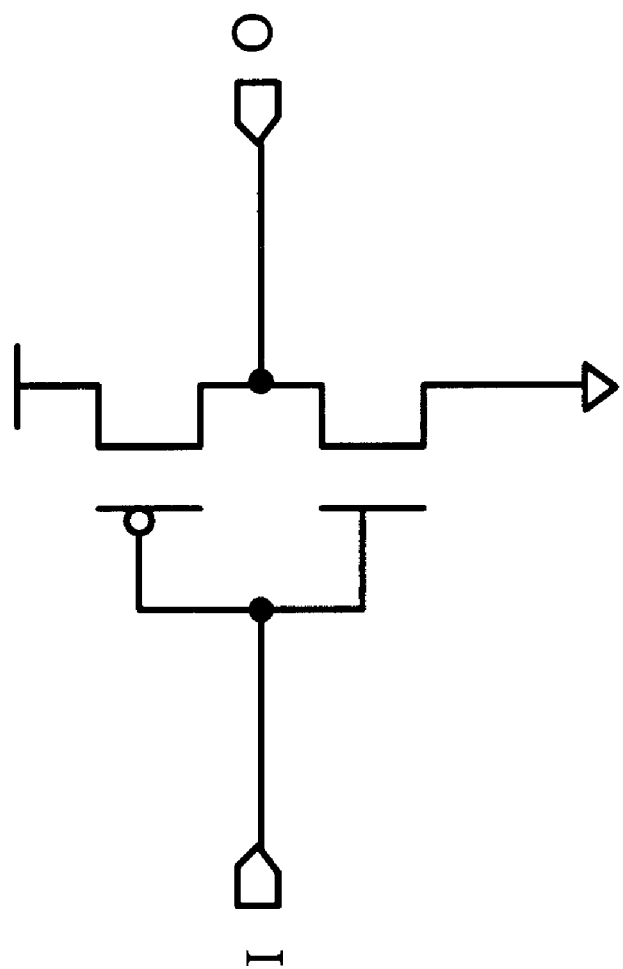
FIG. 5 is a circuit diagram illustrating an embodiment of an inverter.
Figure 6:
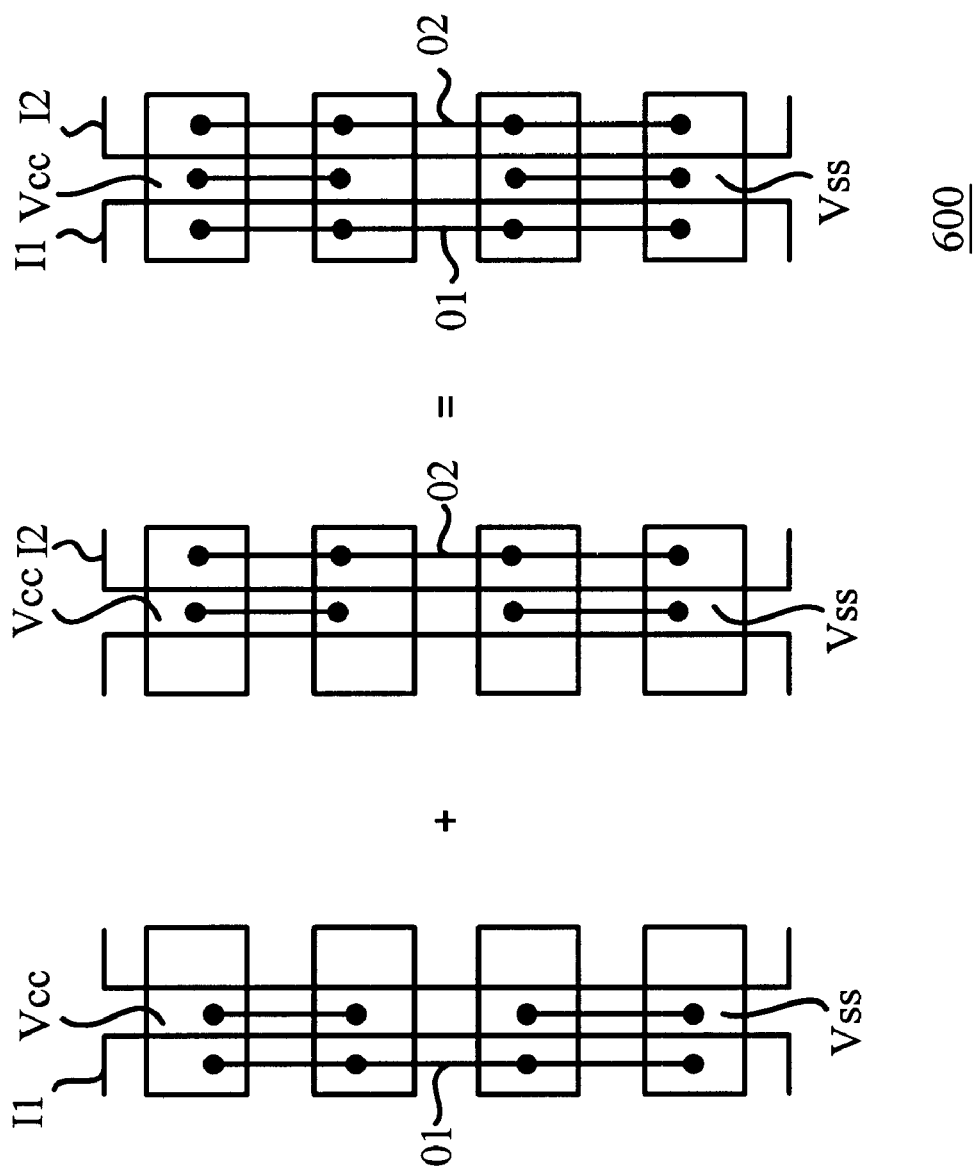
FIG. 6 is a schematic diagram illustrating the layout of metallization for the circuit of FIG. 5 using the embodiment of a gate array architecture of FIG. 1.

In addition to the prior advantages, another advantage of the embodiment of a gate array architecture illustrated in FIG. 1 is that despite its more complex structure it still provides or maintains the flexibility to implement other cells, such as a NAND gate, a NOR gate and a flip-flop, for example. This flexibility is further enhanced by the previously described symmetry of a site, such as 120, 130, and 140, in FIG. 1, for example. In particular, the symmetry of the site may be employed to reduce the number of overall tracks that it takes to implement certain functional blocks. For example, if at least two cells are implemented in this particular embodiment of a gate array architecture, each of which is implemented in less than an integer number of base sites, the at least cells may be placed by the APR tool to be implemented in an integer number of base sites by utilizing the symmetry of the base site so that one of the tracks of each cell overlaps. For example, FIG. 5 is a circuit diagram illustrating an inverter and FIG. 6 is a schematic diagram illustrating the gate array embodiment of FIG. 1 with metallization to implement the inverter of FIG. 5. A close examination of this embodiment reveals that it employs two of the three tracks of a site of the gate array embodiment. Furthermore, another inverter may be formed from a mirror image of the metallization of the left or first track applied to the right or third track, leaving the middle track as it is in FIG. 6. This allows finer granularity in that cells that may occupy less than an integer number of base sites may overlap, as illustrated above, and, therefore, save a base site. Therefore, yet another advantage of this particular embodiment is that due at least in part to the symmetry mentioned above, a integer number of sites may be employed to form by placement adjacent, overlapping cells, where each of the cells employs less than an integer number of base sites, therefore, improving the density of an IC employing this gate array architecture embodiment.

Figure 7:
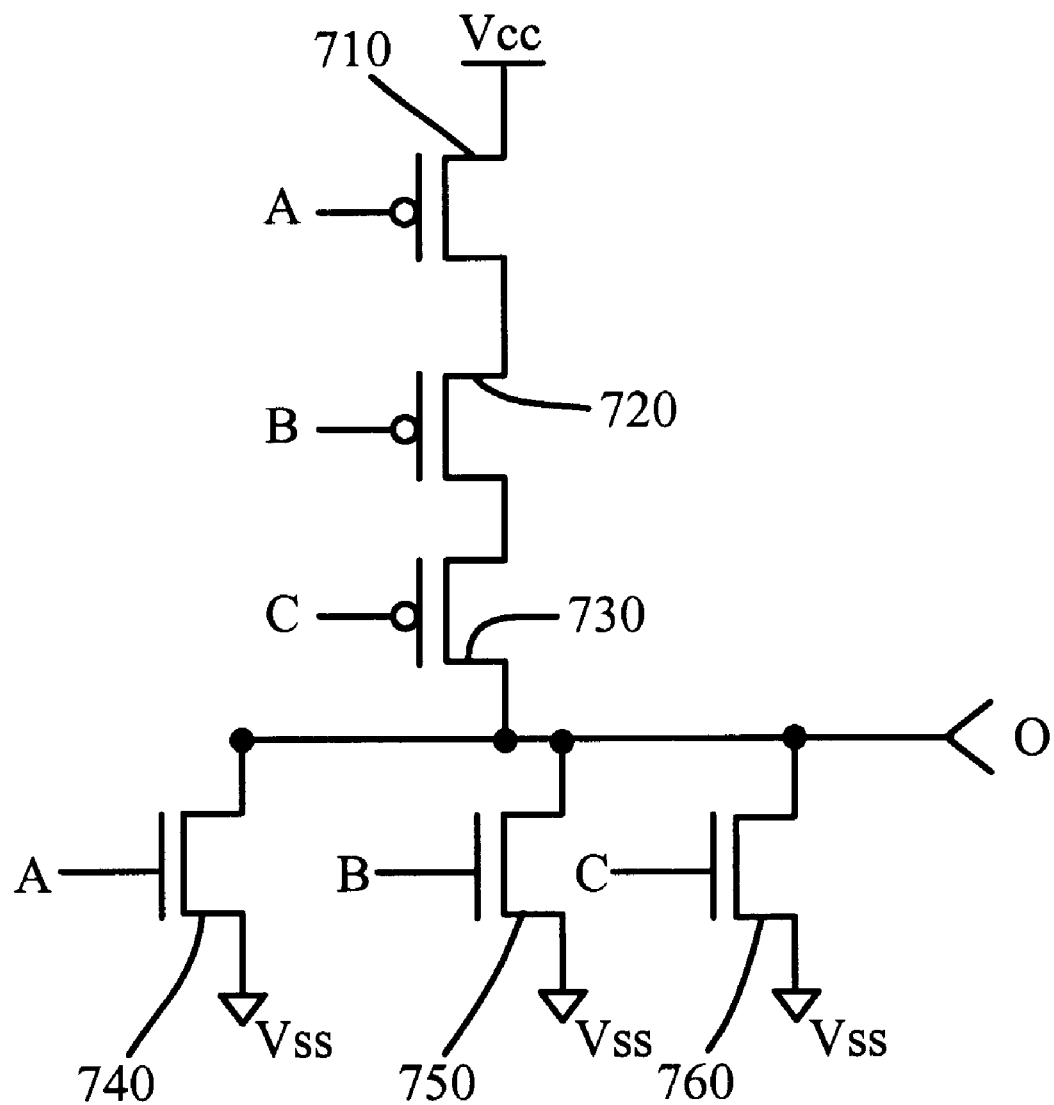
FIG. 7 is a circuit diagram illustrating an embodiment of a NOR gate.
Figure 8:
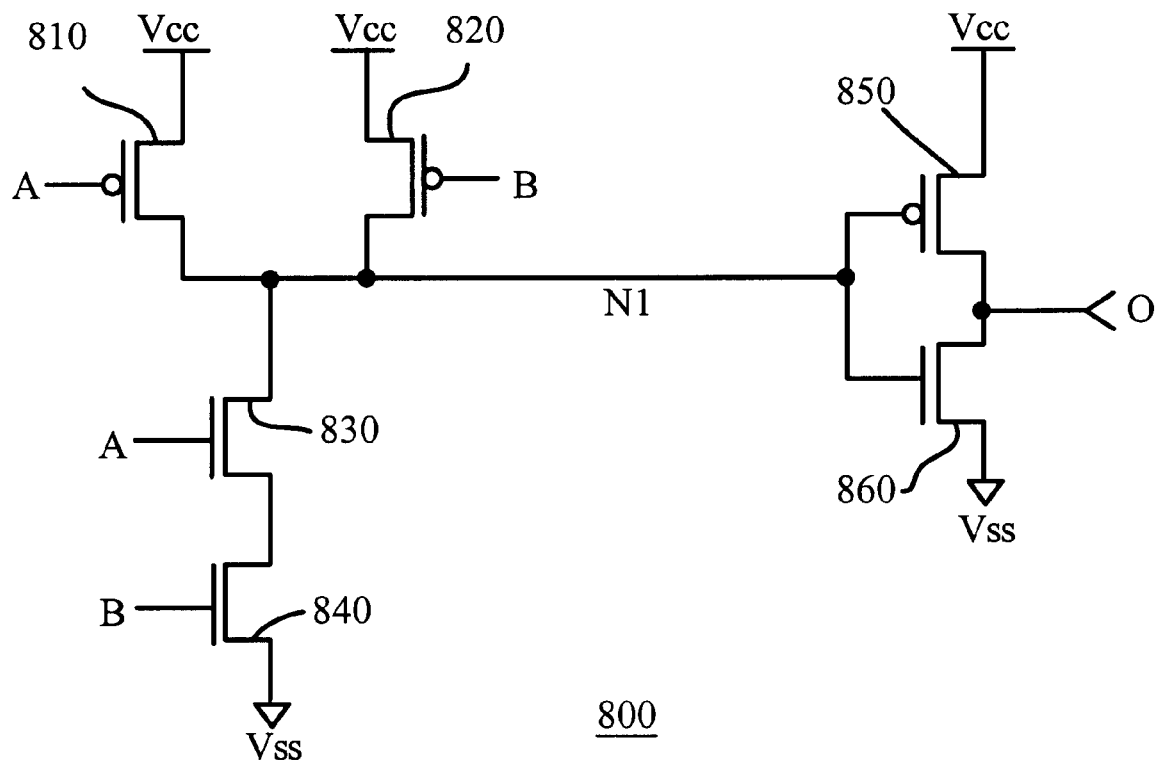
FIG. 8 is a circuit diagram illustrating an embodiment of an AND gate.
Figure 8:
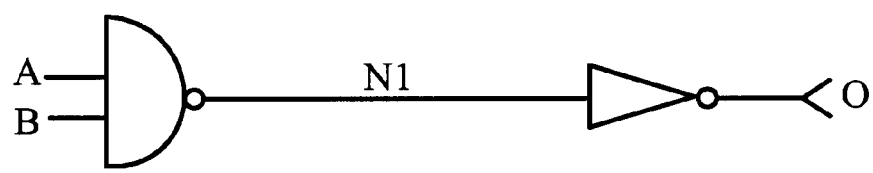
Figure 9:
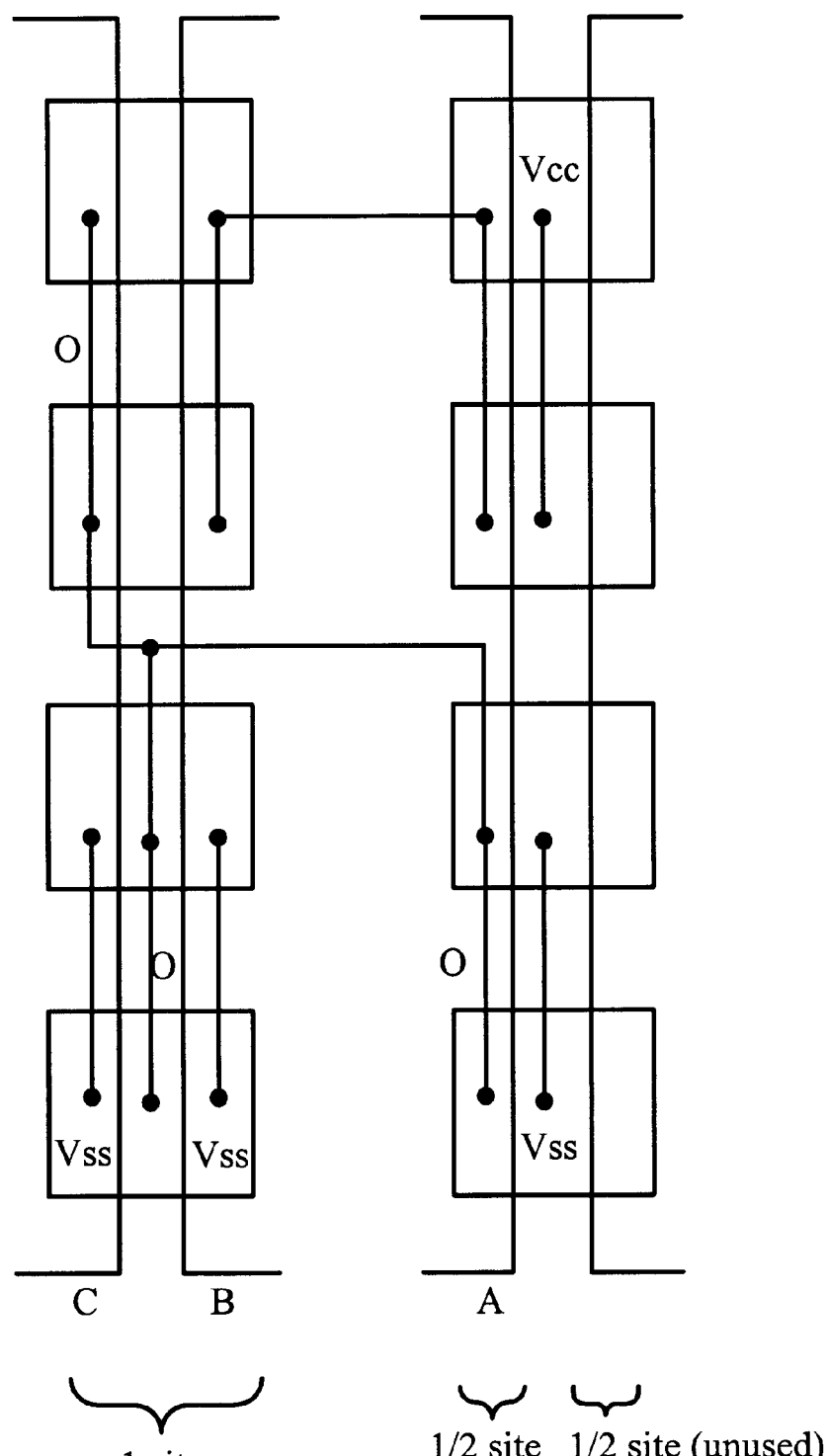
FIG. 9 is a schematic diagram illustrating the layout of metallization for the circuit of FIG. 7 using the embodiment of a gate array architecture of FIG. 1.
Figure 10:
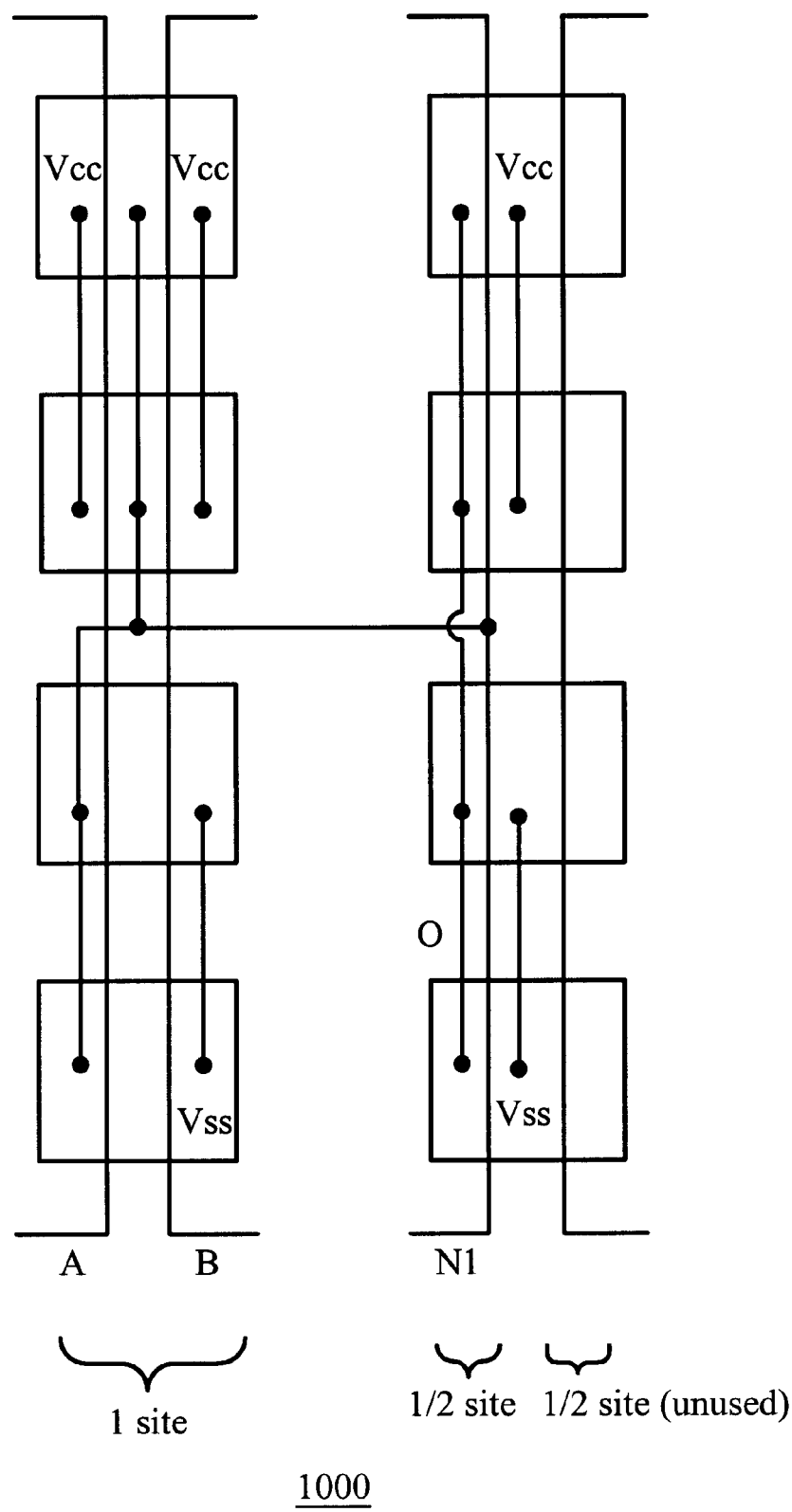
FIG. 10 is a schematic diagram illustrating the layout of metallization for the circuit of FIG. 8 using the embodiment of a gate array architecture of FIG. 1.

FIGS. 7 to 10 illustrate another example in which the symmetry of the base site may be employed to improve the density of the IC where this particular embodiment of a gate array architecture is employed. FIG. 7 is a circuit diagram illustrating an embodiment of a three-input port NOR gate. FIG. 8 is a circuit diagram illustrating an embodiment of a two-input port AND gate. FIG. 9 is a schematic diagram illustrating the gate array embodiment of FIG. 1 with metallization to implement the circuit of FIG. 7. FIG. 10 is a schematic diagram illustrating the gate array embodiment of FIG. 1 with metallization to implement the circuit of FIG. 8. Therefore, as previously described, by using the symmetry of the base site, these two cells may be placed so that they are implemented in three sites or nine tracks by overlapping a middle track in a middle site of three base sites, whereas, without the overlap, the two cells would occupy four sites or twelve tracks.

Figure 11:
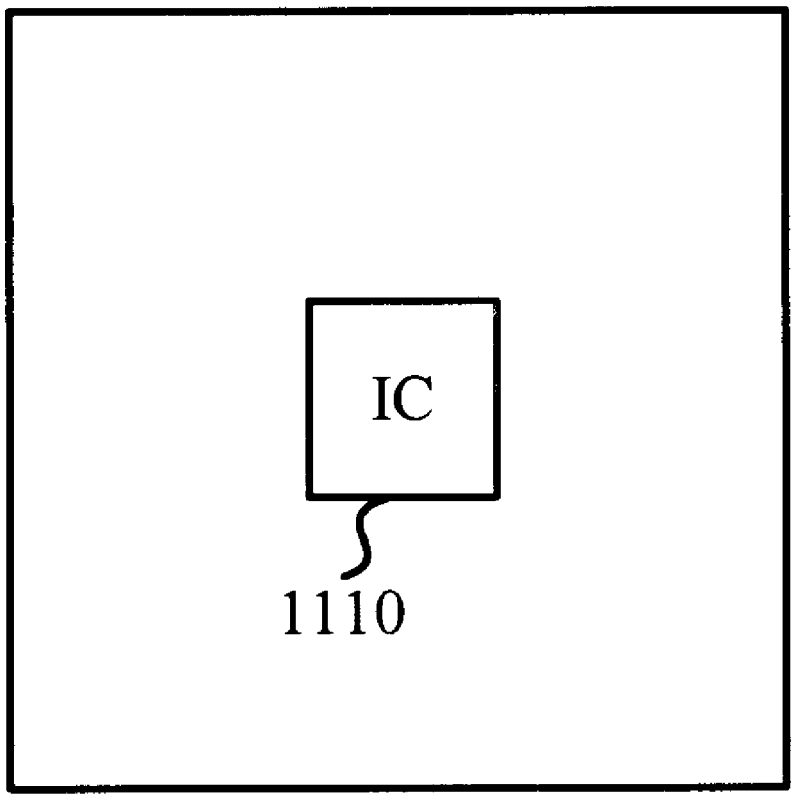
FIG. 11 is a schematic diagram illustrating an embodiment of an integrated circuit (IC) in accordance with the present invention that may be incorporated into a variety of platforms.

Therefore, this particular gate array architecture may be repeated throughout an integrated circuit chip and employed to implement a variety of functional elements for the overall chip. Such an integrated circuit chip employing this particular embodiment of a gate array architecture, may typically be included on a motherboard that is incorporated in a personal computer, such as a lap top or desk top computer, although the invention is not limited in scope in this respect. Likewise, it might be employed in a communication device, such as a pager or cell phone, or, alternatively, in a computer peripheral, just to provide a few additional examples. For example, FIG. 11 is a schematic diagram illustrating an embodiment 1110 of an IC in accordance with the present invention. As illustrated, embodiment 1110 is incorporated in unit 1100, that may comprise a computer, a computer peripheral, a communication device, or another platform that may employ such an embodiment.

The invention, of course, is also not limited in scope to a particular technique for fabricating an integrated circuit chip that includes an embodiment of a gate array architecture in accordance with the present invention. However, typically, a silicon substrate is processed to form a gate array architecture of transistors in the substrate prior to the formation of the metallization interconnect. As previously described, this is one of the advantages of employing a gate array architecture. A variety of techniques for processing a silicon substrate to form the gate array architecture are known and may be employed. Furthermore, typically, the polysilicon overlay structures are formed as part of the gate array architecture for the embodiment illustrated in FIG. 1, for example. Once the gate array architecture has been fabricated, the metallization interconnect may be formed overlying gate array architecture.

Another advantage of this particular embodiment of a gate array architecture in accordance with the present invention, as previously described, is that it may be stored electronically as a data file, for example. Where the gate array architecture is employed in this fashion, an article, such as a storage medium comprising, for example, a disk or hard drive, may have instructions stored thereon. The instructions, when executed, such as by a computer or similar computing platform, result in the capability being available to design the layout of an integrated circuit chip for fabrication. In this particular embodiment, of course, the integrated circuit chip includes a gate array architecture. The gate array architecture includes at least one base site, the at least one base site being three tracks wide and including four N-type transistors and four P-type transistors. Likewise, the additional features previously described may also be designed.

While certain features of the invention have been illustrated as described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. An integrated circuit comprising:
    a gate array architecture;
    said gate array architecture including at least one base site, the at least one base site being three tracks wide and including four N-type transistors and four P-type transistors;
    wherein two polysilicon overlay structures connect the N-type transistors and the P-type transistors in the at least one base site.

2. The integrated circuit of claim 1, and further comprising a metallization interconnect overlying said gate array architecture.

3. The integrated circuit of claim 1, wherein the at least one base site is symmetrical about its middle track.

4. The integrated circuit of claim 3, wherein said gate array architecture is repeated in said integrated circuit.

5. The integrated circuit of claim 2 wherein said metallization interconnect couples at least some of the transistors in said gate array architecture to implement at least two cells in an integer number of base sites, each of said at least two cells being implemented in less than an integer number of base sites.

6. The integrated circuit of claim 5, wherein said at least two cells comprise two inverters, and wherein said metallization couples at least some of the transistors in said gate array architecture to implement said two inverters in one base site.

7. The integrated circuit of claim 2, wherein said metallization interconnect is capable of coupling at least some of the transistors in the gate array architecture to implement at least one of a NAND gate, a NOR gate, an inverter and a flip-flop.

8. The integrated circuit of claim 2, wherein said metallization interconnect couples at least some of the transistors in said gate array architecture to implement a multiplexer in one base site.

9. The integrated circuit of claim 8, wherein said muliplexer comprises a two-to-one unbuffered multiplexer.

10. The integrated circuit of claim 4, wherein said integrated circuit is incorporated in a communications device.

11. The integrated circuit of claim 3, wherein said integrated circuit is attached to a motherboard.

12. The integrated circuit of claim 11, wherein said motherboard is incorporated in a personal computer.

13. The integrated circuit of claim 12, wherein said personal computer comprises one of a laptop and a desktop computer.

14. A method of fabricating an integrated circuit chip comprising:

processing a semiconductor substrate to form a gate array architecture of transistors in the substrate, the gate array architecture comprising at least one base site, the at least one base site being three tracks wide and including four N-type transistors and four P-type transistors;

wherein processing the semiconductor substrate to form a gate array architecture includes:

forming two polysilicon overlay structures as part of said gate array architecture, said two polysilicon overlay structures connecting the N-type and P-type transistors in the at least one base site.

15. The method of claim 14, wherein the at least one base site is symmetrical about its middle track.

16. The method of claim 15, and further comprising:

forming a metallization interconnect overlying said gate array architecture.

17. The method of claim 16, wherein forming a metallization interconnect comprises forming a metallization interconnect that couples at least some of the transistors in said gate array architecture to implement a multiplexer in one base site.

18. The method of claim 17, wherein said multiplexer comprises a two-to-one unbuffered multiplexer.

19. The method of claim 16, wherein forming a metallization interconnect comprises forming a metallization interconnect that couples at least some of the transistors in said gate array architecture to implement at least two cells in an integer number of base sites, each of said at least two cells being implemented in less than an integer number of base sites.

20. The method of claim 19, wherein said at least two functional blocks comprise two inverters, and wherein said metallization couples at least some of the transistors in said gate array architecture to implement said two inverters in one base site.

* * * * *